(12) United States Patent
Mizutani et al.

(10) Patent No.: US 9,947,510 B2
(45) Date of Patent: Apr. 17, 2018

(54) METHOD FOR SUPPLYING GAS, AND PLASMA PROCESSING APPARATUS

(71) Applicant: TOKYO ELECTRON LIMITED, Tokyo (JP)

(72) Inventors: Tomoyuki Mizutani, Miyagi (JP); Hiroshi Tsujimoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/783,981

(22) PCT Filed: May 2, 2014

(86) PCT No.: PCT/JP2014/062184
§ 371 (c)(1),
(2) Date: Oct. 12, 2015

(87) PCT Pub. No.: WO2014/185300
PCT Pub. Date: Nov. 20, 2014

(65) Prior Publication Data
US 2016/0064192 A1    Mar. 3, 2016

(30) Foreign Application Priority Data
May 13, 2013  (JP) ................................ 2013-101411

(51) Int. Cl.
*H01J 37/32*    (2006.01)
*H01L 21/3065*  (2006.01)

(52) U.S. Cl.
CPC .... *H01J 37/32091* (2013.01); *H01J 37/3244* (2013.01); *H01J 37/32449* (2013.01); *H01L 21/3065* (2013.01)

(58) Field of Classification Search
CPC ........... H01L 37/32091; H01L 37/3344; H01L 1121/3065
See application file for complete search history.

(56) References Cited

U.S. PATENT DOCUMENTS

| | | | |
|---|---|---|---|
| 7,896,967 B2 | 3/2011 | Hayasaka et al. | |
| 2008/0153309 A1* | 6/2008 | Sakai | C23C 16/345 438/758 |

(Continued)

FOREIGN PATENT DOCUMENTS

| | | |
|---|---|---|
| JP | H0945624 A | 2/1997 |
| JP | 2000091320 A | 3/2000 |

(Continued)

OTHER PUBLICATIONS

International Search Report dated Aug. 12, 2014 for PCT/JP2014/062184, 2 pages.

*Primary Examiner* — Duy Vu N Deo
(74) *Attorney, Agent, or Firm* — Rothwell, Figg, Ernst & Manbeck, P.C.

(57) ABSTRACT

In the exemplary embodiment, a method for supplying a gas is provided. This method includes supplying a processing gas to each of a central gas inlet portion and a peripheral gas inlet portion through a first branch line and a second branch line; closing a valve at a downstream side in a gas line for an additional gas, and filling the additional gas in a tube between the valve and an upstream flow rate controller; opening the valve after filling the additional gas, and supplying a high frequency power to one of an upper electrode and a lower electrode from a high frequency power supply after opening the valve.

10 Claims, 6 Drawing Sheets

(56) References Cited

U.S. PATENT DOCUMENTS

2009/0117746 A1* 5/2009 Masuda .......... C23C 16/45561
                                                        438/710
2011/0120563 A1* 5/2011 Hayasaka ............ C23C 16/455
                                                        137/1
2011/0220609 A1* 9/2011 Yaegashi .......... H01J 37/32091
                                                        216/12

FOREIGN PATENT DOCUMENTS

JP   2007-208194 A   8/2007
TW     201011121 A1  3/2010

* cited by examiner (a)

(b)

METHOD FOR SUPPLYING GAS, AND PLASMA PROCESSING APPARATUS

CROSS REFERENCE TO RELATED APPLICATIONS

This application is a national phase of PCT application No. PCT/JP2014/062184, filed on 2 May 2014, which claims priority from Japanese patent application No. 2013-101411, filed on 13 May 2013, all of which are incorporated herein by reference.

TECHNICAL FIELD

The exemplary embodiment of the present disclosure relates to a method of supplying a gas and a plasma processing apparatus.

BACKGROUND ART

In manufacturing of an electronic device such as, for example, a semiconductor device, a plasma processing may be performed on a processing target object as a kind of processing in some cases. In the plasma processing, a gas is supplied into a processing container, so that plasma of the gas is generated. When the processing target object is exposed to the plasma, a processing such as, for example, film formation or etching, is performed on the processing target object. As a kind of a plasma processing apparatus for performing such a plasma processing, a capacitively-coupled parallel-flat plate plasma processing apparatus is known.

The parallel-flat plate plasma processing apparatus includes a processing container, a mounting stage, and a shower head. The mounting stage is provided within the processing container, and constitutes a lower electrode. The shower head is a structure for supplying a gas into the processing container, and constitutes an upper electrode. In the plasma processing apparatus, when the gas is supplied into the processing container, a high frequency power is supplied to the upper electrode or the lower electrode. Accordingly, plasma of the gas is generated within the processing container.

Meanwhile, in the plasma processing, the in-plane uniformity in the processing of the processing target object becomes an important factor. As for one method of improving the in-plane uniformity of the plasma processing, there has been suggested a technology of supplying gases having different gas species and/or different flow rates to a central region and a peripheral region of the processing target object, respectively. Such a technology is disclosed in Patent Document 1.

In the technology disclosed in Patent Document 1, an internal space of the shower head is divided into two gas diffusion chambers. A processing gas is supplied to each of the two gas diffusion chambers from a source of the processing gas through a first branch pipe and a second branch pipe. Also, an additional gas supply pipe extending from a source of an additional gas is connected to the second branch pipe. The additional gas supply pipe includes a flow rate controller for controlling the flow rate of the additional gas. In the technology of Patent Document 1, after the processing gas is supplied to the first branch pipe and the second branch pipe, the additional gas set to have a first-out flow rate larger than a predetermined flow rate (hereinafter, referred to as a "processing flow rate") is supplied to the additional gas supply pipe. Accordingly, the pressure of the additional gas supply pipe is rapidly increased. Then, the flow rate of the additional gas is returned to the processing flow rate. Then, a high frequency power is supplied to the upper electrode to generate plasma. Accordingly, in the technology of Patent Document 1, a time required until the flow rate of the additional gas supplied into the processing container reaches the processing flow rate is shortened.

PRIOR ART DOCUMENT

Patent Document

Patent Document 1: Japanese Patent Laid-Open Publication No. 2007-208194

SUMMARY OF INVENTION

Problems to be Solved

However, the flow rate controller has an upper limit on a controllable maximum output flow rate. More specifically, the flow rate controller having a large maximum output flow rate is degraded in a control performance in the flow rate range at the time of processing the processing target object. Accordingly, in order to control the processing flow rate with a high accuracy at the time of processing the processing target object, it is necessary to use the flow rate controller having a small maximum output flow rate. As described above, since there is a limitation in the magnitude of the first-out flow rate, in some cases, the first-out flow rate may not be set to a large flow rate. Accordingly, it may become necessary to set a longer time to flow the additional gas at the first-out flow rate. When a length of time in which the additional gas is flowed at the first-out flow rate is prolonged, a length of time in which the processing gas is flowed prior to supplying the high frequency power is also prolonged. Also, in the technology disclosed in Patent Document 1, the length of time until the additional gas is stabilized to the processing flow rate after making the additional gas start to flow at the first-out flow rate is also prolonged. Accordingly, in the technology disclosed in Patent Document 1, the amount of the processing gas wasted without being used for the processing may be increased. Also, when the length of time until the additional gas is stabilized to the processing flow rate after making the additional gas start to flow at the first-out flow rate is prolonged, the throughput is also reduced. Under such a background, it becomes necessary to supply the additional gas at a large flow rate at the time of starting the supply of the additional gas without being limited to the upper limit flow rate of the flow rate controller.

Means for Solving the Problems

In an aspect, there is provided a method for supplying a gas into a processing container of a plasma processing apparatus configured to process a processing target object. The plasma processing apparatus includes: the processing container; a mounting stage provided within the processing container to constitute a lower electrode; a shower head provided above the mounting stage to constitute an upper electrode; a high frequency power supply configured to supply a high frequency power to one of the upper electrode and the lower electrode; and a gas supply system configured to supply a processing gas and an additional gas to the shower head. The shower head includes a central gas inlet portion facing a central region of the mounting stage, and a peripheral gas inlet portion facing a region outside the central region of the mounting stage. The gas supply system includes: a first gas source configured to supply the processing gas; a second gas source configured to supply the additional gas; a first branch line and a second branch line configured to supply the processing gas from the first gas source, to the central gas inlet portion and the peripheral gas inlet portion, respectively; and a gas line connecting the second gas source to the second branch line and including a flow rate controller, a valve provided between the flow rate controller and the second branch line, and a tube provided between the flow rate controller and the valve. The method includes: supplying the processing gas to each of the central gas inlet portion and the peripheral gas inlet portion through the first branch line and the second branch line, filling the additional gas in the tube by closing the valve, opening the valve after filling the additional gas, and supplying the high frequency power to one of the upper electrode and the lower electrode from the high frequency power supply after opening the valve.

In the method described above, by closing the valve at a downstream side in the gas line for supplying the additional gas, the additional gas is filled in the tube between the valve at the downstream side and the flow rate controller at the upstream. Accordingly, the additional gas may be filled in the tube at a high pressure without being limited to the maximum flow rate of the flow rate controller. Since the additional gas at the high pressure filled as described above may be discharged by opening the valve, the additional gas at a large flow rate may be temporarily supplied at the time of starting the supply of the additional gas. Also, according to this method, a time required for stabilizing the additional gas to the processing flow rate may be shortened. Also, a process of filling the additional gas in the tube may be performed in a period independent of the supply of the processing gas. Accordingly, according to the method, the waste of the processing gas may be suppressed, and the throughput may be improved.

In an aspect, the filling of the additional gas may be performed in a period where the processing target object is exchanged. The method of this aspect may further include closing the flow rate controller after the filling. According to this aspect, in a period where the processing target object is exchanged, the additional gas may be filled in the tube. Therefore, the throughput is not dependent on the time required for filling the additional gas.

Effect of the Invention

As described above, according to an aspect of the present disclosure, the additional gas at a large flow rate at the supply initiation of the additional gas may be supplied without being limited to the upper limit flow rate of the flow rate controller.

DETAILED DESCRIPTION OF THE INVENTION

Figure 1:
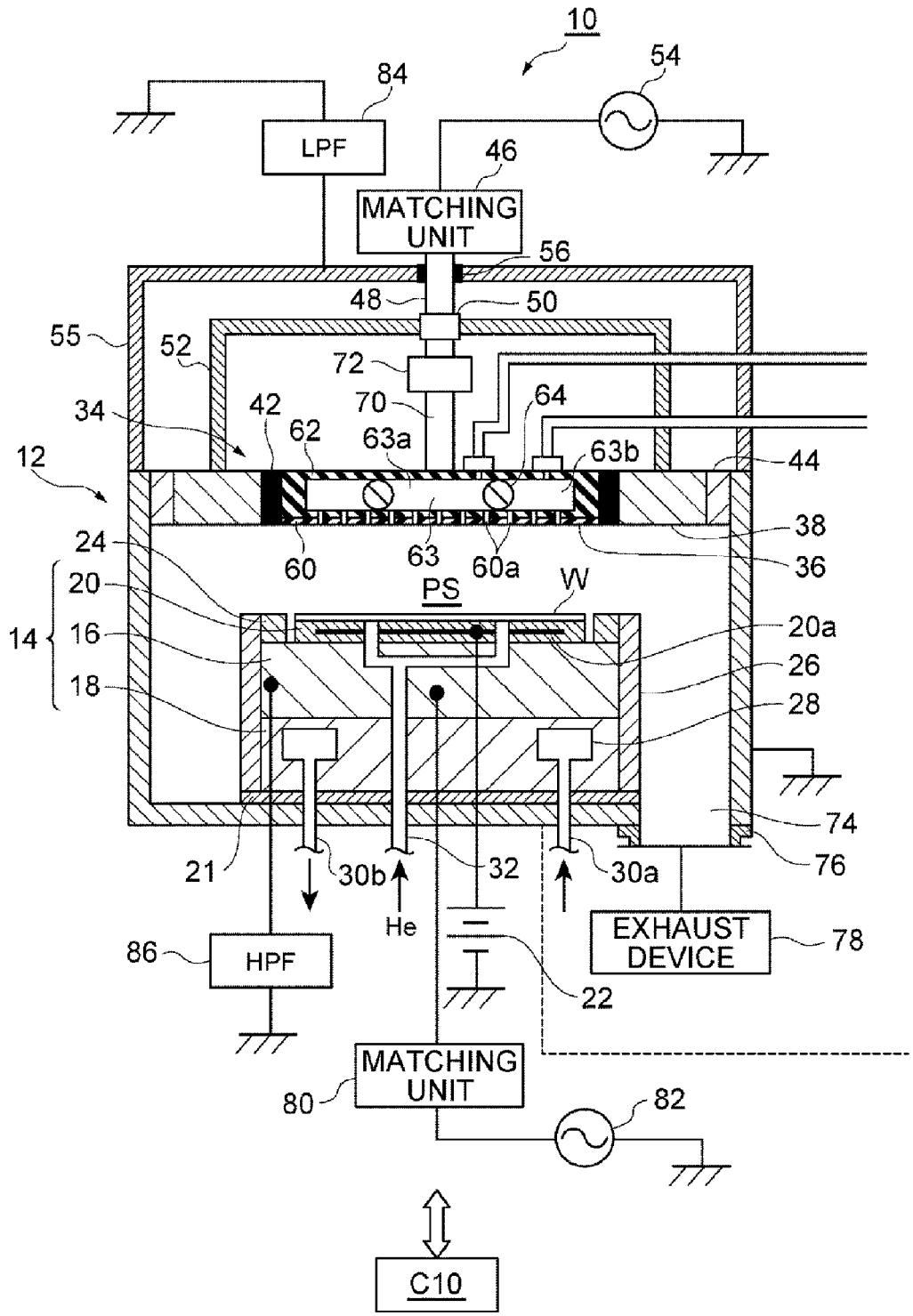
FIG. 1 is a sectional view schematically illustrating a plasma processing apparatus according to an exemplary embodiment.

Hereinafter, various exemplary embodiments will be described in detail with reference to drawings. Meanwhile, the same or corresponding parts will be given the same reference numerals in the drawings.

First, a plasma processing apparatus according to an exemplary embodiment will be described. FIG. 1 is a sectional view schematically illustrating the plasma processing apparatus according to the exemplary embodiment. Meanwhile, in FIG. 1, a gas supply system of the plasma processing apparatus is omitted.

A plasma processing apparatus 10 illustrated in FIG. 1 includes a processing container 12. The processing container 12 has a substantially cylindrical shape in the exemplary embodiment. The processing container 12 is made of, for example, an aluminum alloy, and is electrically grounded. Also, the inner wall surface of the processing container 12 is subjected to an alumite treatment. Meanwhile, the inner wall surface of the processing container 12 may be covered with an yttrium oxide film. The processing container 12 defines a processing space PS as its internal space.

A mounting stage 14 is provided within the processing container 12. In the exemplary embodiment, the mounting stage 14 includes a susceptor 16, a susceptor support 18, and an electrostatic chuck 20. The mounting stage 14 is provided on a bottom portion of the processing container 12 through an insulating plate 21.

The susceptor 16 has a disk shape made of, for example, aluminum, and constitutes a lower electrode. The susceptor 16 is mounted on the insulating plate 21 through the susceptor support 18.

The electrostatic chuck 20 is provided on the susceptor 16. The electrostatic chuck 20 has an electrode film 20a provided as an inner layer of an insulating film. A DC power supply 22 is electrically connected to the electrode film 20a. The electrostatic chuck 20 is configured to generate a Coulomb force by a DC voltage applied from the DC power supply 22 to the electrode film 20a, and to attract a processing target object (hereinafter, referred to as a "wafer") W by the Coulomb force.

A focus ring 24 is provided on the susceptor 16 and around the electrostatic chuck 20. Meanwhile, a cylindrical inner wall member 26 is attached to the outer peripheral surface of the susceptor 16 and the susceptor support 18. The inner wall member 26 is made of, for example, quartz.

Inside the susceptor support 18, a refrigerant chamber 28 is formed. The refrigerant chamber 28 spirally extends within the susceptor support 18, for example, from the peripheral portion toward the central portion, and spirally extends from the central portion toward the peripheral portion. The refrigerant chamber 28 is connected to a chiller unit provided outside the processing container 12 through pipes 30a and 30b. A refrigerant such as, for example, refrigerant liquid or a cooling water, is supplied to the refrigerant chamber 28 to be circulated. Accordingly, the temperature of the wafer W on the susceptor 16 may be controlled.

Also, a gas supply line 32 is formed in the mounting stage 14 through the susceptor support 18, the susceptor 16, and the electrostatic chuck 20. The gas supply line 32 extends to the top surface of the electrostatic chuck 20. A heat transfer gas such as, for example, He gas, is supplied to the gas supply line 32. Accordingly, a heat transfer gas is supplied to a gap between the wafer W and the top surface of the electrostatic chuck 20.

An upper electrode 34 is formed above the mounting stage 14. The upper electrode 34 is provided substantially in parallel to the susceptor 16. The processing space PS described above is defined between the upper electrode 34 and the mounting stage 14.

The upper electrode 34 has an inner electrode portion 36 and an outer electrode portion 38. The inner electrode portion 36 is configured in substantially a disk shape having a cavity therein. The outer electrode portion 38 has a ring shape that surrounds the inner electrode portion 36. An annular dielectric 42 is interposed between the inner electrode portion 36 and the outer electrode portion 38. Also, an insulating shielding member 44 is interposed between the outer electrode portion 38 and the inner wall surface of the processing container 12 to annularly extend.

A first high frequency power supply 54 is electrically connected to the outer electrode portion 38 through a power feed tube 52, a connector 50, an upper power feed rod 48, and a matching unit 46. The first high frequency power supply 54 generates a high frequency power having a frequency suitable for generating plasma, for example, a frequency of 40 MHz or more. The high frequency power is, for example, 60 MHz.

The power feed tube 52 has a substantially cylindrical shape which is reduced in diameter at the top portion. The lower end portion of the power feed tube 52 is connected to the outer electrode portion 38. The upper central portion of the power feed tube 52 is connected to the upper power feed rod 48 through the connector 50. The upper end portion of the upper power feed rod 48 is connected to the output side of the matching unit 46. The matching unit 46 is connected to the first high frequency power supply 54. The matching unit 46 has a circuit configured to match the internal impedance of the first high frequency power supply 54 with the load impedance.

The outside of the power feed tube 52 is covered with a ground conductor 55. The ground conductor 55 is configured in a cylindrical shape having the same outer diameter as, for example, the outer diameter of the processing container 12. The lower end portion of the ground conductor 55 is connected to the top portion of the side wall of the processing container 12. Also, the upper central portion of the ground conductor 55 is opened, and the upper power feed rod 48 is inserted through the opening. An insulating member 56 is interposed between the upper central portion of the ground conductor 55 and the upper power feed rod 48.

The inner electrode portion 36 constitutes a shower head of the exemplary embodiment. In the exemplary embodiment, the inner electrode portion 36 includes an electrode plate 60 and an electrode support 62. The electrode plate 60 has substantially a disk shape. In the electrode plate 60, a large number of gas ejecting ports 60a are formed. The electrode plate 60 is detachably supported by the electrode support 62. The electrode support 62 is configured in a disk shape that defines a cavity 63 therein, and has substantially the same diameter as that of the electrode plate 60.

In the exemplary embodiment, the cavity 63 within the electrode support 62 is partitioned into two gas diffusion chambers 63a and 63b by a partition wall 64 that is formed in substantially a ring shape. The gas diffusion chamber 63a extends above the central region of the mounting stage 14, and the gas diffusion chamber 63b extends above the region outside the central region. A large number of holes are formed in the bottom wall of the electrode support 62 to communicate with the gas ejecting ports 60a, respectively. In the shower head configured as described above, the gas diffusion chamber 63a, and the holes and the gas ejecting ports 60a connected to the gas diffusion chamber 63a constitute a central gas inlet portion. The central gas inlet portion faces the central region of the mounting stage 14, that is, the central region of the wafer W, to supply a gas toward the central region of the wafer W. Also, the gas diffusion chamber 63b, and the holes and the gas ejecting ports 60a connected to the gas diffusion chamber 63b constitute a peripheral gas inlet portion. The peripheral gas inlet portion faces the region of the mounting stage 14 outside the central region, that is, the region outside the central region of the wafer W, e.g., an edge region, to supply a gas toward the outside region. Meanwhile, in the exemplary embodiment illustrated in FIG. 1, the number of the peripheral gas inlet portion is one, but two or more peripheral gas inlet portions may be concentrically provided.

As illustrated in FIG. 1, a lower power feed tube 70 is connected to the top surface of the electrode support 62. The lower power feed tube 70 is connected to the upper power feed rod 48 through a connector 50. In the middle of the lower power feed tube 70, a variable capacitor 72 is provided. By adjusting the capacitance of the variable capacitor 72, it is possible to adjust a relative ratio of the electric field intensity occurring just below the outer electrode portion 38 to the electric field intensity occurring just below the inner electrode portion 36 based on the high frequency power from the first high frequency power supply 54. Meanwhile, in the plasma processing apparatus illustrated in FIG. 1, the first high frequency power supply 54 for plasma generation is electrically connected to the upper electrode 34, but the first high frequency power supply 54 may be connected to the susceptor 16, that is, the lower electrode.

An exhaust port 74 is formed at the bottom portion of the processing container 12. The exhaust port 74 is connected to an exhaust device 78 through an exhaust pipe 76. The exhaust device 78 may include, for example, a pressure regulator and a vacuum pump. The internal space of the processing container 12 may be exhausted by the exhaust device 78 to decompress the internal space of the processing container 12 to a desired vacuum degree.

Also, a second high frequency power supply 82 is connected to the susceptor 16 through a matching unit 80. The second high frequency power supply 82 generates a high frequency power for drawing-in of ions. The frequency of the high frequency power generated by the second high frequency power supply 82 ranges from, for example, 2 MHz to 20 MHz, and is, for example, 2 MHz.

Also, as illustrated in FIG. 1, a low pass filter (LPF) 84 is electrically connected to the inner electrode portion 36. The low pass filter 84 is configured to block a high frequency power from the first high frequency power supply 54, and to pass a high frequency power from the second high frequency power supply 82 to ground. Meanwhile, a high pass filter (HPF) 86 is electrically connected to the susceptor 16 that constitutes the lower electrode. The high pass filter 86 is configured to pass a high frequency power from the first high frequency power supply 54 to ground.

Figure 2:
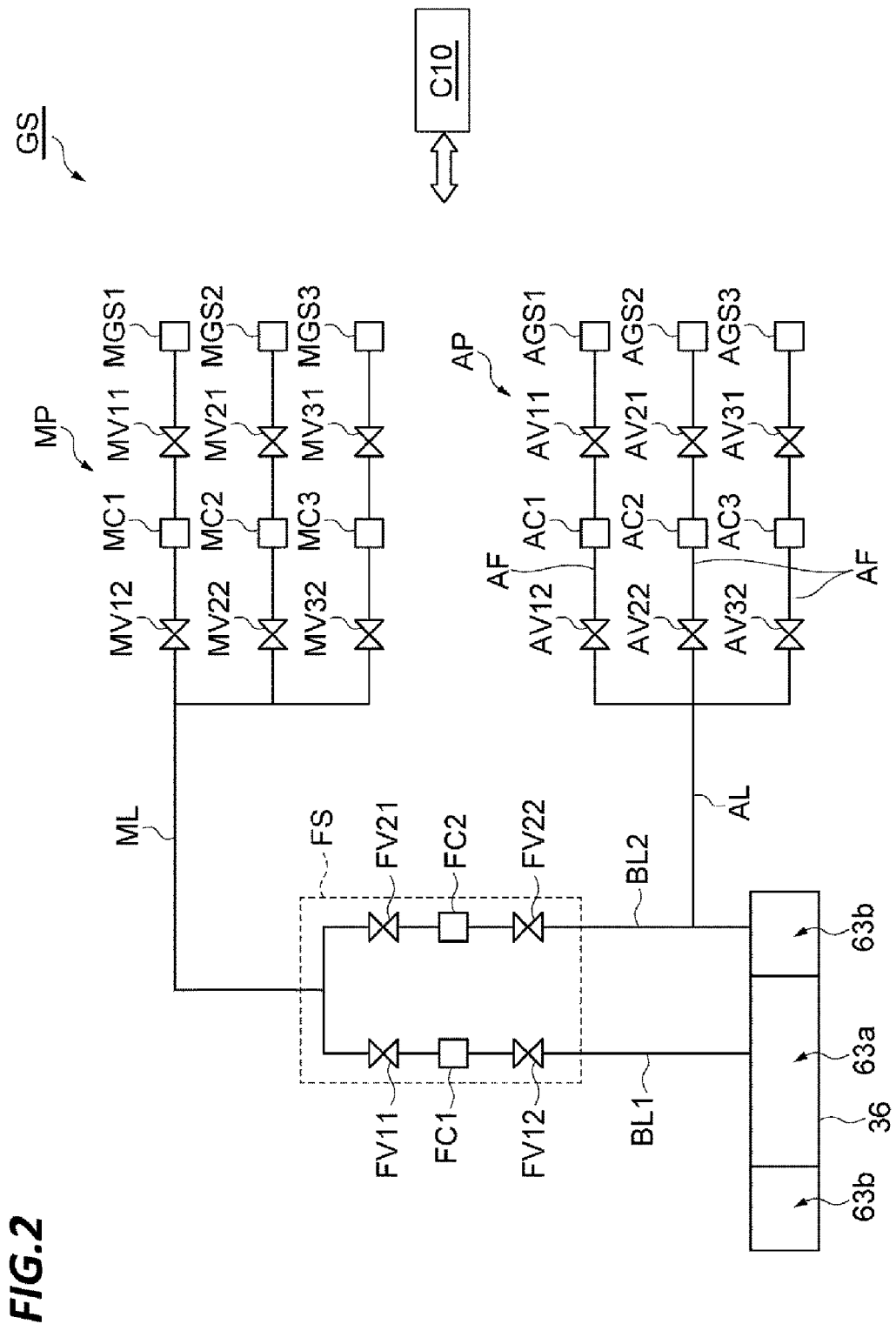
FIG. 2 is a view illustrating a gas supply system according to the exemplary embodiment.

Subsequently, FIG. 2 will be referred to. FIG. 2 is a view illustrating a gas supply system according to an exemplary embodiment. The plasma processing apparatus 10 illustrated in FIG. 1 may include a gas supply system GS illustrated in FIG. 2. The gas supply system GS includes a main gas supply unit MP and an additional gas supply unit AP.

The main gas supply unit MP may include one or more gas sources (a first gas source). In the exemplary embodiment, the main gas supply unit MP includes three gas sources MGS1, MGS2, and MGS3 as illustrated in FIG. 2. These gas sources MGS1, MGS2, and MGS3 may be a source of an etching gas, a source of a gas for controlling deposition of a reaction product, and a source of a carrier gas, respectively. For example, when a silicon oxide film is etched, the gas source MGS1 may be a source of a fluorocarbon-based gas, that is, a fluorocarbon gas and/or a fluorohydrocarbon gas. As for the fluorocarbon-based gas, $C_xF_y$ gas such as $CF_4$, $C_4F_6$, $C_4F_8$, or $C_5F_8$ may be used. Also, the gas source MGS2 may be, for example, a source of $O_2$ gas. Also, the gas source MGS3 may be a source of a rare gas such as, for example, Ar gas.

The gas source MGS1 is connected to a common gas line ML through a valve MV11, a flow rate controller MC1 such as, for example, a mass flow controller, and a valve MV12. The gas source MGS2 is connected to the common gas line ML through a valve MV21, a flow rate controller MC2 such as, for example, a mass flow controller, and a valve MV22. Also, the gas source MGS3 is connected to the common gas line ML through a valve MV31, a flow rate controller MC3 such as, for example, a mass flow controller, and a valve MV32.

The common gas line ML is connected to a partial flow rate regulator FS such as, for example, a flow splitter. The partial flow rate regulator FS splits a gas supplied from the common gas line ML into two or more branch lines at a flow rate ratio which is properly set. The partial flow rate regulator FS may include, for example, a valve FV11, a flow rate controller FC1 such as, for example, a mass flow controller, a valve FV12, a valve FV21, a flow rate controller FC2 such as, for example, a mass flow controller, and a valve FV22. Within the partial flow rate regulator FS, the gas from the common gas line ML is diverged into two lines. One line includes the valve FV11, the flow rate controller FC1, and the valve FV12, and is connected to a first branch line BL1. The first branch line BL1 is connected to the gas diffusion chamber 63a of the shower head. The other line includes the valve FV21, the flow rate controller FC2, and the valve FV22, and is connected to a second branch line BL2. The branch line BL2 is connected to the gas diffusion chamber 63b. Accordingly, the main gas supply unit MP is capable of supplying a processing gas at a set flow rate ratio to the central gas inlet portion and the peripheral gas inlet portion.

As illustrated in FIG. 2, the additional gas supply unit AP may include one or more gas sources (a second gas source). In the exemplary embodiment, the additional gas supply unit AP includes three gas sources AGS1, AGS2, and AGS3 as illustrated in FIG. 2. These gas sources AGS1, AGS2, and AGS3 may be a source of an etching promoting gas, a source of a gas for controlling deposition of a reaction product, and a source of a carrier gas, respectively. For example, when a silicon oxide film is etched, the gas source AGS1 may be a source of a fluorocarbon-based gas, that is, a fluorocarbon gas and/or a fluorohydrocarbon gas. As for the fluorocarbon-based gas, $C_xF_y$ gas such as, for example, $CF_4$, $C_4F_6$, $C_4F_8$, or $C_5F_8$ may be used. Also, the gas source AGS2 may be, for example, a source of $O_2$ gas. Also, the gas source AGS3 may be a source of a rare gas such as, for example, Ar gas. Meanwhile, the gas sources AGS1, AGS2, and AGS3 may be gas sources of any other gases.

The gas source AGS1 is connected to a gas line AL through a valve AV11, a flow rate controller AC1 such as, for example, a mass flow controller, and a valve AV12. The gas source AGS2 is connected to the gas line AL through a valve AV21, a flow rate controller AC2 such as, for example, a mass flow controller, and a valve AV22. Also, the gas source AGS3 is connected to the gas line AL through a valve AV31, a flow rate controller AC3 such as, for example, a mass flow controller, and a valve AV32. Meanwhile, the valve AV11, the flow rate controller AC1, the valve AV12, the valve AV21, the flow rate controller AC2, the valve AV22, the valve AV31, the flow rate controller AC3, the valve AV32, and the gas line AL constitute a gas line of the exemplary embodiment that connects the sources of the additional gas, that is, the gas sources AGS1, AGS2, and AGS3 to the second branch line BL.

The gas line AL is connected to the middle of the second branch line BL2. Accordingly, the additional gas supplied from the additional gas supply unit AP is mixed with the processing gas at the confluence point of the second branch line BL2 and the gas line AL. Accordingly, the mixed gas of the processing gas and the additional gas is supplied to the peripheral gas inlet portion that includes the gas diffusion chamber 63b.

Hereinafter, FIG. 1 together with FIG. 2 will be referred to. The plasma processing apparatus 10 further includes a controller C10. The controller C10 may be a computer device that includes an input device such as, for example, a keyboard, a storage device for various recipes and control programs, and a central processing apparatus. The controller C10 sends a control signal to the high frequency power supply 54 in order to control the supply and stop of a high frequency power from the high frequency power supply 54, and the magnitude of the high frequency power. The controller C10 sends a control signal to the high frequency power supply 82 in order to control the supply and stop of a high frequency power from the high frequency power supply 82 and the magnitude of the high frequency power. Also, the controller C10 may send a control signal to the exhaust device 78 in order to control the exhaust amount of the exhaust device 78. Also, the controller C10 sends a control signal to the valves MV11, MV12, MV21, MV22, MV31, and MV33, and the flow rate controllers MC1, MC2, and MC3 in order to control the opening/closing of these valves and the output flow rates of these flow rate controllers. Accordingly, the controller C10 may adjust the gas species and the flow rate ratio of one or more gases in the processing gas supplied from the main gas supply unit MP. Also, the controller C10 sends a control signal to the valves FV11, FV12, FV21, and FV22, and the flow rate controllers FC1 and FC2 in order to control the opening/closing of these valves and the output flow rates of these flow rate controllers. Accordingly, the controller C10 may control the distribution ratio of the partial flow rate regulator FS. Also, the controller C10 sends a control signal in order to control the opening/closing of the valves AV11, AV12, AV21, AV22, AV31, and AV32, and the output flow rates of the flow rate controllers AC1, AC2, and AC3. Accordingly, the controller C10 may adjust the gas species and the flow rate ratio of one or more gases in the additional gas from the additional gas supply unit AP.

Figure 3:
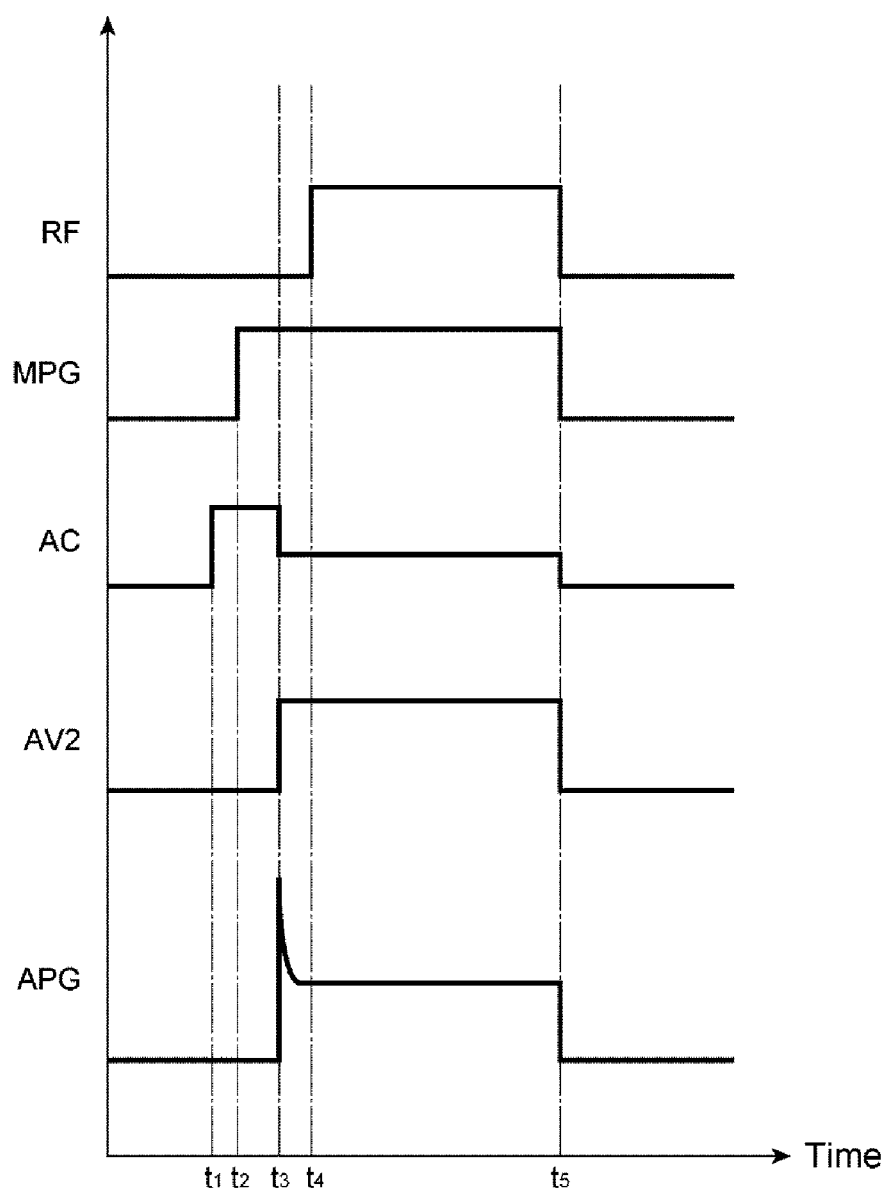
FIG. 3 is a timing chart for explaining a method of supplying a gas according to the exemplary embodiment.

Hereinafter, descriptions will be made on a gas supply method according to the exemplary embodiment together with a specific example of a control in the plasma processing apparatus 10, with reference to FIG. 3. FIG. 3 is a timing chart for explaining a method of supplying a gas according to the exemplary embodiment. Meanwhile, in FIG. 3, "RF" indicates the state of a high frequency power generated by the high frequency power supply 54. The RF at a high level indicates that the high frequency power is being supplied from the high frequency power supply 54 to the upper electrode 34. Meanwhile, the RF at a low level indicates that the supply from the high frequency power supply 54 to the upper electrode 34 is stopped. In FIG. 3, "MPG" indicates the state of a processing gas of the main gas supply unit MP. The MPG at a high level indicates that the processing gas is being supplied to the central gas inlet portion and the peripheral gas inlet portion, and the MPG at a low level indicates that the supply of the processing gas from the main gas supply unit MP to the central gas inlet portion and the peripheral gas inlet portion is stopped. In FIG. 3, "AC" indicates an output flow rate of at least one flow rate controller used in this method among the flow rate controllers AC1, AC2, and AC3. The AC at the lowest level indicates that the output flow rate of the flow rate controller is 0. Also, in FIG. 3, "AV2" indicates a state of at least one downstream side valve used in this method, among the valves AV12, AV22, and AV32 provided at the downstream sides of the flow rate controllers of the additional gas supply unit AP. The AV2 at a high level indicates that the downstream side valve is opened, and the AV2 at a low level indicates that the downstream side valve is closed. Also, in FIG. 3, APG indicates an actual flow rate of the additional gas supplied from the additional gas supply unit AP, in the second branch line BL2.

(Main Gas Supply Process)

A main gas supply process is performed in the gas supply method according to the exemplary embodiment. In the example illustrated in the timing chart of FIG. 3, this process is continued from time $t_2$ to time $t_5$. In the main gas supply process, the controller C10 executes a first control. Specifically, a set of valves selected among a set of the valves MV11 and MV12, a set of the valves MV21 and MV22, and a set of the valves MV31 and MV32 are opened. Also, the output flow rate of a flow rate controller selected among the flow rate controllers MC1, MC2, and MC3 is set. Also, the valves FV11, FV12, FV21, and FV22 are opened, and the output flow rates of the flow rate controllers FC1 and FC2 are set. In this main gas supply process, a processing gas is supplied into the processing container 12 from the central gas inlet portion and the peripheral gas inlet portion of the shower head.

(Additional Gas Filling Process)

An additional gas filling process is continued from time $t_1$ to time $t_3$, in the example illustrated in the timing chart of FIG. 3. In the additional gas filling process, the controller C10 executes a second control. Specifically, a downstream side valve used in the present method among the valves AV12, AV22, and AV32 provided at the downstream sides of the flow rate controllers of the additional gas supply unit AP is closed. Also, the output flow rate of the flow rate controller used in the present method among the flow rate controllers AC1, AC2, and AC3 of the additional gas supply unit AP is set to be larger than the flow rate of a gas at the time of processing the wafer W, that is, the processing flow rate. Accordingly, a gas is filled in a tube AF between the downstream side valve and the flow rate controller of the additional gas supply unit AP. Meanwhile, the implementation period of the additional gas filling process is independent of the implementation period of the main gas supply process. Accordingly, the start time of the main gas supply process, $t_2$, may be earlier than the start time of the additional gas supply process, $t_1$, or may be the same as the start time of the additional gas supply process, $t_1$.

(Valve Opening Process)

A valve opening process is executed after the additional gas filling process. In the example illustrated in the timing chart of FIG. 3, the valve opening process starts at time $t_3$. In the valve opening process, the controller C10 executes a third control. Specifically, among AV12, AV22, and AV32 provided at the downstream sides of the flow rate controllers of the additional gas supply unit AP, a downstream side valve that has been closed for gas filling is opened. Accordingly, the gas filled in the tube AF in the additional gas filling process is ejected toward the second branch line BL2. Also, an output flow rate of a flow rate controller used in the present method among the flow rate controllers AC1, AC2, and AC3 of the additional gas supply unit AP is set to a flow rate of a gas at the time of processing the wafer W, that is, a processing flow rate. The processing flow rate is set to a flow rate smaller than that in the additional gas filling process.

(High Frequency Power Supply Process)

Subsequently, in the present method, a high frequency power supply process is performed. The high frequency power supply process is performed after a certain period of time is elapsed from the start time of the valve opening process, that is, after a period of time is elapsed until the concentration of the additional gas within the processing container 12 is stabilized from the start time of the valve opening process. In the example illustrated in the timing chart of FIG. 3, this process is continued from time $t_4$ to time $t_5$. In this process, the controller C10 executes a fourth control. Specifically, the controller C10 causes the high frequency power supply 54 to generate a high frequency power to apply the high frequency power to the upper electrode 34. Meanwhile, in this process, a high frequency power from the high frequency power supply 82 may be applied to the susceptor 16. Accordingly, plasma is generated in the processing space PS within the processing container 12. The wafer W accommodated within the processing container 12 is exposed to the plasma by this process.

Then, in the present method, when the high frequency power supply process is ended, the supply of the high frequency power from the high frequency power supply 54 to the upper electrode 34 is stopped. Also, the supply of the processing gas from the main gas supply unit MP is stopped. Also, the supply of the additional gas from the additional gas supply unit AP is stopped. Also, when the supply of the high frequency power from the high frequency power supply 82 is executed, the supply of the high frequency power is also stopped. Then, the wafer W is taken out from the inside of the processing container 12 by a conveyance robot, and another wafer W is accommodated within the processing container 12 by the conveyance robot.

As described above, according to the method of the exemplary embodiment or the control by the plasma processing apparatus 10, by closing the downstream side valve of the additional gas supply unit AP, a gas may be filled in the tube AF between the flow rate controller and the downstream side valve of the additional gas supply unit AP. Accordingly, the gas may be filled in the tube AF at a high pressure without being limited to the maximum flow rate of the flow rate controller. When the gas filled in the tube AF is discharged by opening the downstream side valve, the flow rate of the additional gas in the gas line AL and the second branch line BL2 may be rapidly stabilized. Further, the concentration of the additional gas within the processing container 12 may be rapidly stabilized. Accordingly, the waste of the processing gas is eliminated. Also, the throughput of the plasma processing is improved.

Figure 4:
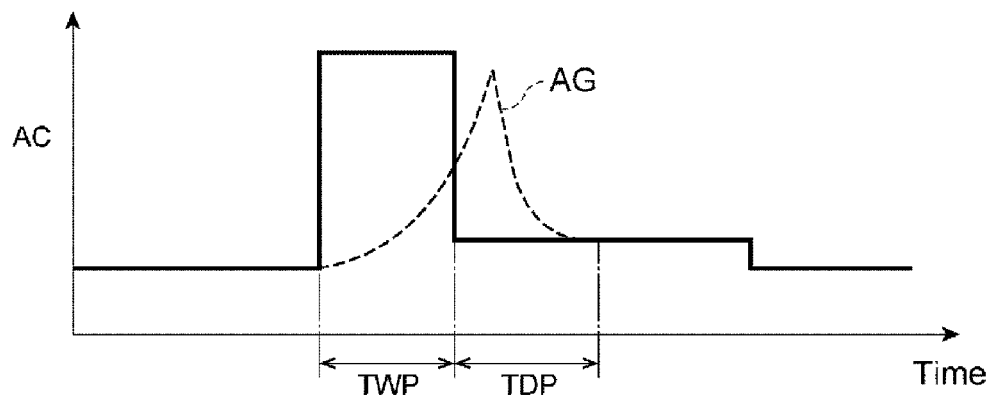
FIG. 4 is a view for comparative explanation on a temporal change of the additional gas concentration within the processing container in a conventional method using a first-out flow rate and a method of the exemplary embodiment.
Figure 4:
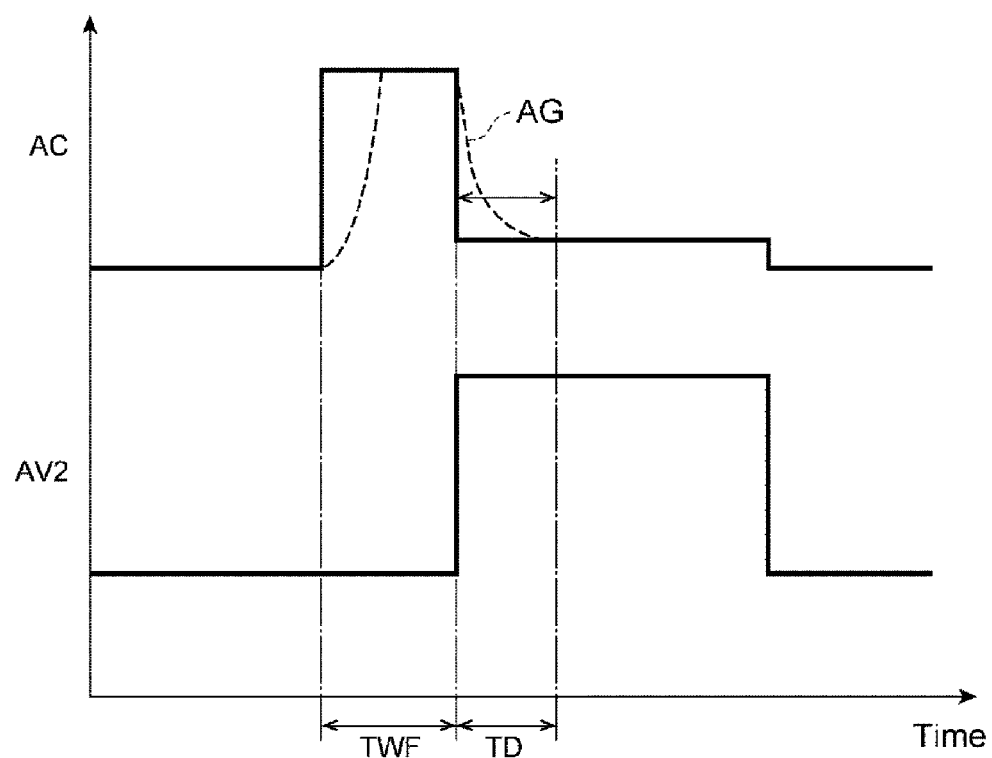

Here, FIG. 4 will be referred to. FIG. 4 is a view for comparative explanation on a temporal change of the additional gas concentration within the processing container in a conventional method using a first-out flow rate and a method of the exemplary embodiment. In FIG. 4, in the region of (a), a temporal change of the additional gas concentration within the processing container is illustrated in a case where a conventional method is used, and in the region of (b), a temporal change of the additional gas concentration within the processing container is illustrated in a case where a method of the exemplary embodiment is used. Meanwhile, the expression method in FIG. 4 is the same as that in FIG. 3 except for points described below.

In the conventional method, as indicated by the solid line in (a) of FIG. 4, the output flow rate of the flow rate controller of the additional gas supply unit AP is set to a first-out flow rate in a period (TWP), and immediately after that, the flow rate controller of the additional gas supply unit AP is set to the processing flow rate. In the conventional method, even if the output flow rate is set as the first-out flow rate, as indicated by the dotted line of the reference numeral AG in (a) of FIG. 4, a long time is required until the concentration of the additional gas within the processing container 12 rises, and also, a time length of a period (TDP) until the concentration of the additional gas within the processing container 12 is stabilized after the output flow rate is set to the processing flow rate, that is, a delay time (TDP) is also prolonged.

Meanwhile, as illustrated in (b) of FIG. 4, in the method of the exemplary embodiment, after a period (TWF) of the additional gas filling process is elapsed, the output flow rate of the flow rate controller of the additional gas supply unit AP is set to the processing flow rate, and the downstream side valve of the additional gas supply unit AP is opened. Accordingly, as indicated by the dotted line of the reference numeral AG in (b) of FIG. 4, a period until the concentration of the additional gas within the processing container 12 is stabilized is shortened. That is, a period (TD) until the concentration of the additional gas within the processing container 12 is stabilized after the output flow rate of the flow rate controller of the additional gas supply unit AP is set to the processing flow rate by opening the downstream side valve of the additional gas supply unit AP, that is, a delay time (TD) is shortened. This is because the additional gas at a high flow rate exceeding the upper limit output flow rate of the flow rate controller may be temporarily flowed by opening the valve. In this manner, in the method of the exemplary embodiment, the delay time (TD) may be shortened, and thus the waste of the processing gas may be suppressed, thereby improving the throughput.

Figure 5:
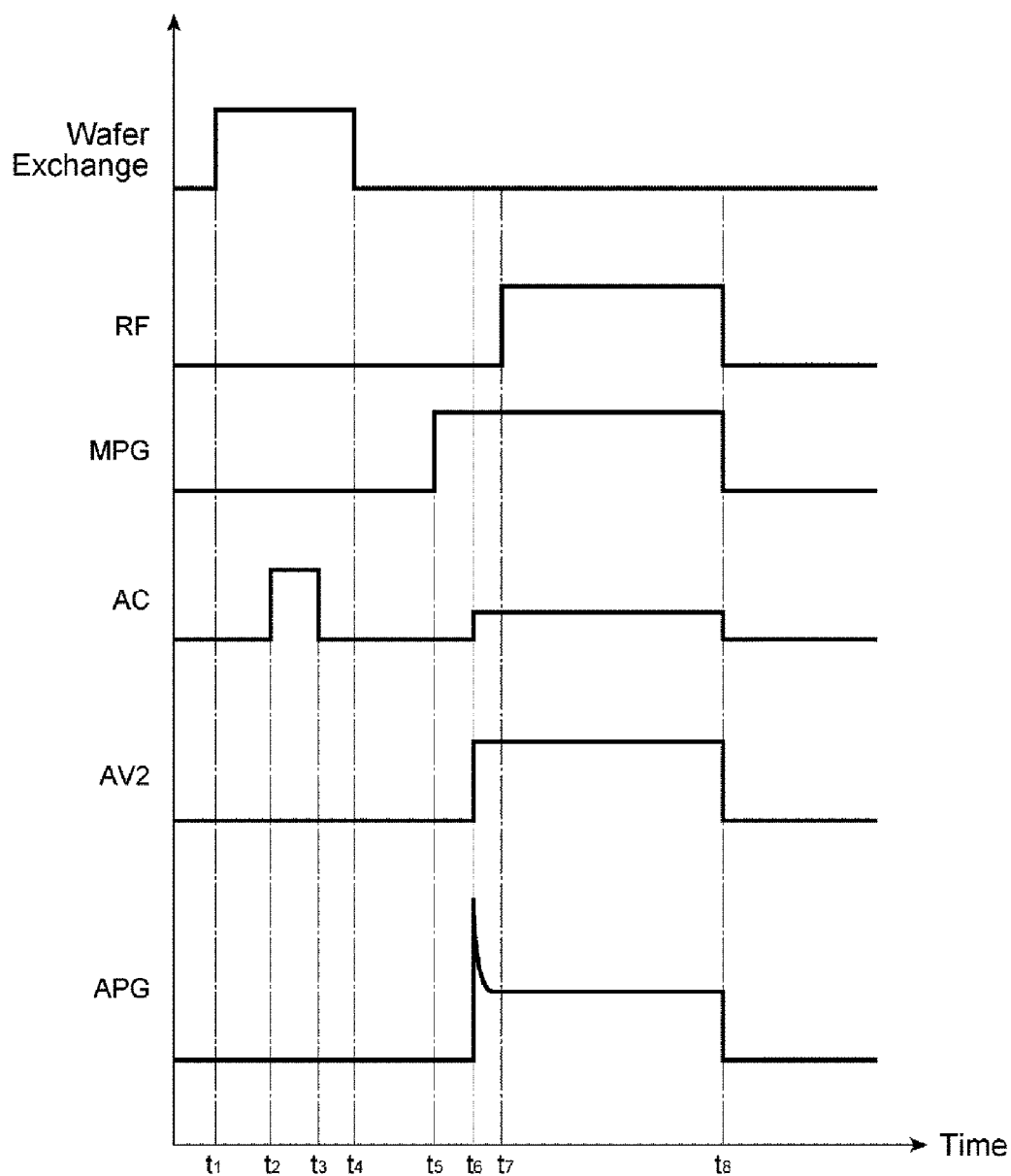
FIG. 5 is a timing chart illustrating an example of a method of supplying a processing gas according to another exemplary embodiment.

Meanwhile, in the exemplary embodiment described above, the additional gas filling process and the main gas supply process are performed partially in parallel. However, the additional gas filling process and the main gas supply process may be executed in different periods. FIG. 5 is a timing chart illustrating an example of a method of supplying a processing gas according to another exemplary embodiment. In FIG. 5, "Wafer Exchange" indicates whether the plasma processing apparatus performs a wafer exchange, and a period of a high level indicates a period where the wafer exchange is being performed.

As illustrated in FIG. 5, in another exemplary embodiment, the exchange of the wafers W is performed from time $t_1$ to time $t_4$. Also, the additional gas filling process is performed in a period from time $t_2$ to time $t_3$, within a period from time $t_1$ to time $t_4$. That is, the additional gas filling process is performed during exchange of the wafers W. Then, the flow rate of the flow rate controller of the additional gas supply unit AP is set to 0 at time $t_3$ when the additional gas filling process is ended. This is intended to prevent the backflow of the gas filled in the tube AF. Meanwhile, the state where the flow rate of the flow rate controller of the additional gas supply unit AP is set to 0 is continued in a period until a start time of the valve opening process, $t_6$.

Then, the exchange of wafers is completed at time $t_4$, and then from the subsequent time $t_5$, the main gas supply process is started. The steps subsequent to the method illustrated in FIG. 5 are the same as those in the method illustrated in FIG. 3. As described above, according to the method illustrated in FIG. 5, the additional gas filling process is performed during the wafer exchange period which is completely independent of the main gas supply process. That is, the additional gas filling process is performed in a period that does not affect the throughput. Accordingly, according to the method illustrated in FIG. 5, the throughput may be further improved.

Experimental Example and Comparative
Experimental Examples 1 and 2

Hereinafter, descriptions will be made on Experimental Example and Comparative Experimental Examples 1 and 2 which were performed to evaluate the gas supply method according to the exemplary embodiment. In Experimental Example and Comparative Experimental Examples 1 and 2, the plasma processing apparatus 10 was used, as for processing gases, $C_4F_8$ gas at 40 sccm, Ar gas at 1400 sccm, and $O_2$ gas at 10 sccm were used, and as for an additional gas, $O_2$ gas was used. Also, in Experimental Example and Comparative Experimental Examples 1 and 2, the processing gas was supplied to the gas diffusion chambers 63a and 63b at a distribution ratio of 50:50.

In Experimental Example, during the supply of the processing gas, the additional gas filling process was performed, and then, the valve at the downstream side of the additional gas supply unit AP was opened, and at the same time, the output flow rate of the flow rate controller of the additional gas supply unit AP was set to the processing flow rate. Also, in Experimental Example, in synchronization with the timing of setting the output flow rate of the flow rate controller of the additional gas supply unit AP to the processing flow rate, a high frequency power was supplied from the high frequency power supply 54 to the upper electrode 34. In Experimental Example, a plasma processing including these series of processes was performed several times. Also, in Experimental Example, various changes were made using an output flow rate of a flow rate controller of an additional gas supply unit AP at the time of filling an additional gas/a period of filling of the additional gas, as a parameter. Specifically, in each of several plasma processings, an output flow rate of a flow rate controller of an additional gas supply unit AP at the time of filling an additional gas/a period of filling of the additional gas was set to any one of 20 sccm/10 sec, 20 sccm/15 sec, 20 sccm/20 sec, and 15 sccm/40 sec. Also, in Experimental Example, the processing flow rate of the additional gas, to which the output flow rate of the flow rate controller of the additional gas supply unit AP is set, was also used as a parameter so that the processing flow rate of the additional gas was varied in the several plasma processings.

In Comparative Experimental Example 1, during the supply of the processing gas, the additional gas was supplied at a fixed processing flow rate without changing the output flow rate of the flow rate controller of the additional gas supply unit AP. In Comparative Experimental Example 1 as well, in synchronization with the timing of setting the output flow rate of the flow rate controller of the additional gas supply unit AP to the processing flow rate, a high frequency power was supplied from the high frequency power supply 54 to the upper electrode 34. Also, in Comparative Experimental Example 1 as well, a plasma processing including these series of processes was performed several times. Also, in Comparative Experimental Example 1, the processing flow rate of the additional gas, to which the output flow rate of the flow rate controller of the additional gas supply unit AP is set, was also used as a parameter so that the processing flow rate of the additional gas was varied in the several plasma processings.

In Comparative Experimental Example 2, during the supply of the processing gas, the output flow rate of the flow rate controller of the additional gas supply unit AP was set to a first-out flow rate of 40 sccm, and this was continued for 2 sec, and then, the output flow rate of the flow rate controller of the additional gas supply unit AP was set to the processing flow rate. In Comparative Experimental Example 2 as well, in synchronization with the timing of setting the output flow rate of the flow rate controller of the additional gas supply unit AP to the processing flow rate, a high frequency power was supplied from the high frequency power supply 54 to the upper electrode 34. Also, in Comparative Experimental Example 2 as well, a plasma processing including these series of processes was performed several times. Also, in Comparative Experimental Example 2 as well, the processing flow rate of the additional gas, to which the output flow rate of the flow rate controller of the additional gas supply unit AP is set, was also used as a parameter so that the processing flow rate of the additional gas was varied in the several plasma processings.

Figure 6:
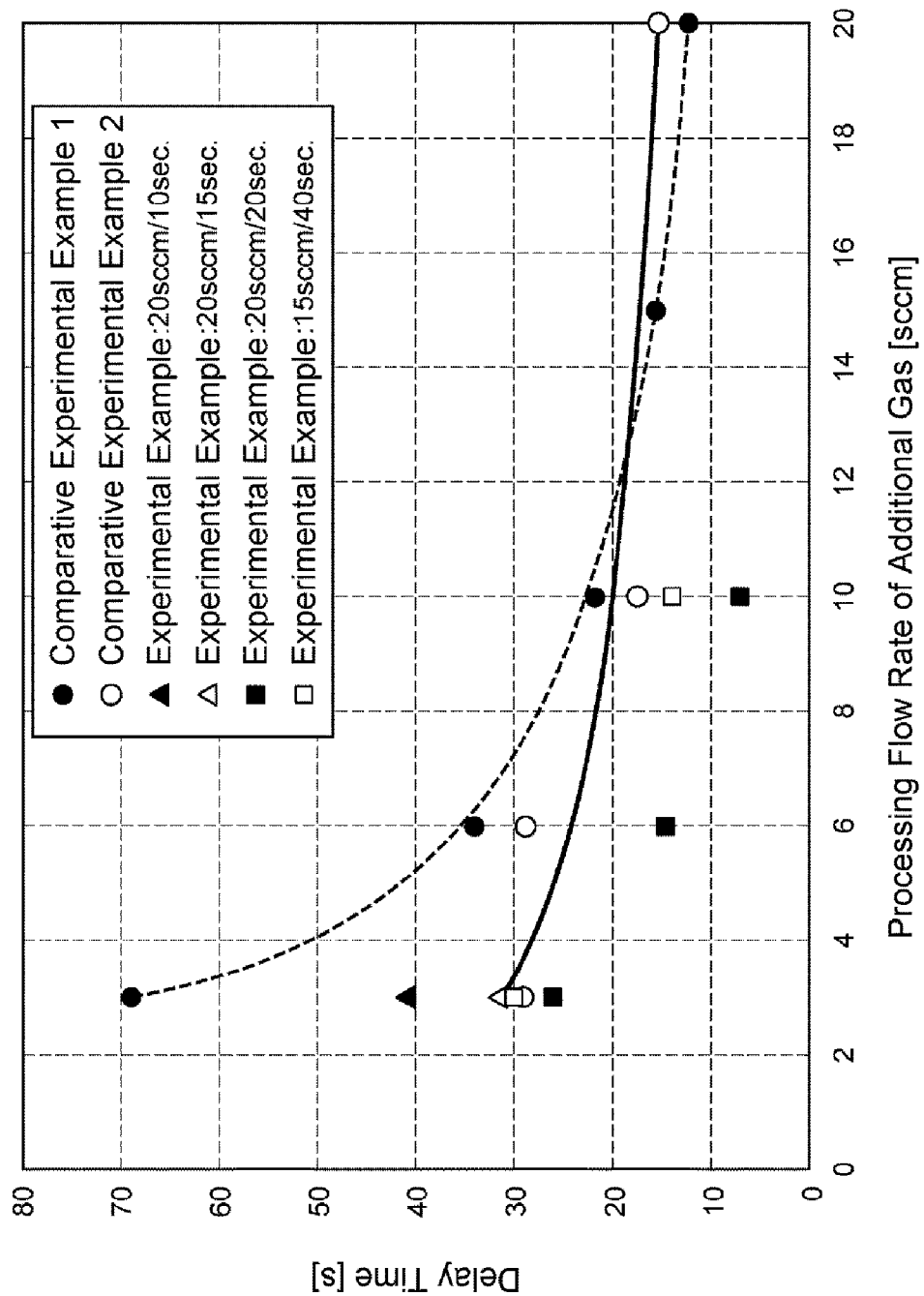
FIG. 6 is a graph illustrating a delay time obtained from Experimental Example and Comparative Experimental Examples 1 and 2.

In Experimental Example, in each of the several plasma processings, by observing the light emission of plasma within the processing container 12, the length of time until the light emission of the plasma is stabilized after the output flow rate of the flow rate controller of the additional gas supply unit AP is set to the processing flow rate, that is, a delay time (see the delay time "TD" in FIG. 4) was obtained. Also, in Comparative Experimental Examples 1 and 2 as well, in each of the several plasma processings, the length of time until the light emission of the plasma is stabilized after the output flow rate of the flow rate controller of the additional gas supply unit AP is set to the processing flow rate, (see, the delay time "TDP" in FIG. 4) was obtained. FIG. 6 illustrates a delay time obtained from Experimental Example and Comparative Experimental Examples 1 and 2. Meanwhile, in FIG. 6, the horizontal axis indicates a processing flow rate of an additional gas, and the vertical axis indicates a delay time.

As illustrated in FIG. 6, according to Experimental Example, it was found that the delay time was reduced as compared to Comparative Experimental Example 1 in which the additional gas was continuously flowed at a fixed flow rate. Also, in Comparative Experimental Example 2 using the first-out flow rate, it was found that when the processing flow rate of the additional gas is 12 sccm or more, the effect caused by using the first-out flow rate is lost. Meanwhile, according to Experimental Example, it was found that the delay time was shortened regardless of the processing flow rate of the additional gas.

EXPLANATION OF REFERENCE NUMERALS

10: plasma processing apparatus, 12: processing container, 14: mounting stage, 16: susceptor, 20: electrostatic chuck, 34: upper electrode, 36: inner electrode portion (shower head), 38: outer electrode portion, 54: high frequency power supply, 63a, 63b: gas diffusion chamber, 82: high frequency power supply, C10: controller, GS: gas supply system, MP: main gas supply unit, MGS1, MGS2, MGS3: gas source, MV11, MV12, MV21, MV22, MV31, MV32: valve, MC1, MC2, MC3: flow rate controller, ML: common gas line, FS: partial flow rate regulator, FV11, FV12, FV21, FV22: valve, BL2: second branch line, AL: gas line, AGS1, AGS2, AGS3: gas source, AV11, AV21, AV31: valve (upstream side valve), AC1, AC2, AC3: flow rate controller, AV12, AV22, AV32: valve (downstream side valve), AF: tube (for filling).

What is claimed is:

1. A method for supplying a gas into a processing container of a plasma processing apparatus configured to process a processing target object, the plasma processing apparatus comprising a shower head including a central gas inlet portion and a peripheral gas inlet portion, and a gas supply system configured to supply a processing gas and an additional gas to the shower head, the method comprising:

supplying the processing gas to each of the central gas inlet portion and the peripheral gas inlet portion through a first branch line and a second branch line;

setting an output flow rate of a flow rate controller to be a first rate, wherein the first rate is larger than a flow rate of the processing gas at a time of processing a wafer;

filling the additional gas in a tube while a valve is closed, wherein the valve is provided between the flow rate controller and the second branch line, and the tube is provided between the flow rate controller and the valve;

opening the valve after filling the additional gas;

subsequent to opening the valve, setting the output flow rate of the flow rate controller to be the flow rate of the processing gas at the time of processing a wafer; and supplying a high frequency power to one of an upper electrode and a lower electrode of the plasma processing apparatus after opening the valve.

2. The method of claim 1, wherein the filling of the additional gas is performed in a period where the processing target object is exchanged, and the method further comprises:

closing the flow rate controller after the filling.

3. The method of claim 1, further comprising:

waiting for a first period of time after opening the value and before supplying the high frequency power.

4. The method of claim 1, wherein supplying the processing gas and filling the additional gas are performed at least partially in parallel.

5. The method of claim 1, wherein supplying the processing gas and filling the additional gas are performed in different periods of time, respectively.

6. The method of claim 1, wherein supplying the processing gas and filling the additional gas are performed independently.

7. The method of claim 1, wherein the processing gas comprises $C_4F_8$ gas, Ar gas, and $O_2$ gas.

8. The method of claim 1, wherein the additional gas comprises $O_2$ gas.

9. The method of claim 1, wherein supplying the processing gas, filling the additional gas, opening the value, and supplying the high frequency power are repeated multiple times.

10. A method for supplying a processing gas into a processing container of a plasma processing apparatus, the method comprising:
   supplying the processing gas from a first gas source into a processing chamber of the plasma processing apparatus;
   setting an output flow rate of a flow rate controller to be a first rate, wherein the first rate is larger than a flow rate of the processing gas at a time of processing a wafer;
   filling an additional gas in a tube from a second gas source while a valve is closed, wherein the valve is provided between the flow rate controller and the processing chamber and the tube is provided between the flow rate controller and the valve;
   opening the valve after filling the additional gas;
   subsequent to opening the valve, setting the output flow rate of the flow rate controller to be the flow rate of the processing gas at the time of processing a wafer; and
   supplying a high frequency power to the plasma processing apparatus after opening the valve.

* * * * *